United States Patent
Ashizawa et al.

(10) Patent No.: US 6,914,797 B2
(45) Date of Patent: Jul. 5, 2005

(54) SEMICONDUCTOR MEMORY

(75) Inventors: Tetsuo Ashizawa, Kawasaki (JP);
Wataru Yokozeki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/629,588

(22) Filed: Jul. 30, 2003

(65) Prior Publication Data

US 2004/0032768 A1 Feb. 19, 2004

(30) Foreign Application Priority Data

Aug. 13, 2002 (JP) ........................................ 2002-235896

(51) Int. Cl.⁷ ............................................... G11C 11/24
(52) U.S. Cl. ...................................... 365/145; 365/154
(58) Field of Search .................................. 365/145, 154

(56) References Cited

U.S. PATENT DOCUMENTS 5,477,499 A * 12/1995 Van Buskirk et al. ... 365/185.3
5,629,888 A * 5/1997 Saito et al. ................. 365/145
5,986,924 A    11/1999 Yamada ...................... 365/154

FOREIGN PATENT DOCUMENTS

| JP | Hei 11-16363 | 1/1999 |
| JP | 2000-114399 | 4/2000 |

* cited by examiner

*Primary Examiner*—Michael Tran
(74) *Attorney, Agent, or Firm*—Arent Fox PLLC

(57) ABSTRACT

First buffers of a first driver circuit generate voltages to be supplied to word lines, respectively. Second buffers of a second driver circuit operate in synchronization with the first buffers to generate voltages to be supplied to first substrate lines, respectively. Each second buffer, upon access to memory cells, supplies a voltage for lowering the threshold values of transfer transistors and driver transistors to its corresponding first substrate line, and supplies thereto a voltage for raising the threshold values of the transfer transistors and the driver transistors during standby. This can improve the operation speed at the time of accessing the memory cells and reduce the leak current during standby. This results in shortening the access time during the operation of the semiconductor memory and reducing the standby current during standby.

20 Claims, 13 Drawing Sheets

SEMICONDUCTOR MEMORY

CROSS REFERENCE TO RELATED APPLICATION

This application is based upon and claims the benefit of priority from the prior Japanese Patent Application No. 2002-235896, filed on Aug. 13, 2002, the entire contents of which are incorporated herein by reference.

BACKGROUND OF THE INVENTION

1. Field of the Invention

The present invention relates to a static RAM.

2. Description of the Related Art

Recently, the operating frequencies of systems which implement static RAMs (hereinafter, referred to as SRAMs) have been on the increase. Moreover, SRAMs with lower power consumption have been demanded in particular for the sake of reducing entire power consumption of portable equipment. Under the circumstances, SRAMs with faster access time and smaller consumption current during a standby period (standby current) have been required.

Japanese Unexamined Patent Application Publication No. Hei 11-16363 discloses an SRAM containing memory cells each composed of six transistors, having the structure that the substrates (p-well regions) of transfer transistors and load transistors are connected to word lines.

In the SRAM disclosed therein, the transfer transistors and the load transistors decrease in threshold value when the word lines are turned to high level to access the memory cells, and increase when the word lines are turned to low level to retain data in the memory cells. At the time of accessing the memory cells, the currents flowing through the transfer transistors and the load transistors increase to shorten the access time. During standby, the transfer transistors and the load transistors decrease in leak current, thereby reducing the standby current.

Moreover, Japanese Unexamined Patent Application Publication No. 2000-114399 discloses an SRAM containing memory cells each composed of six transistors, having the structure that the gates of transfer transistors and driver transistors are connected to their own substrates. In addition, as with typical SRAMs, load transistors and driver transistors form two CMOS inverters having inputs and outputs connected to each other.

In the SRAM disclosed therein, the transfer transistors decrease in threshold value when the word lines are turned to high level to access the memory cells, and increase when the word lines are turned to low level to retain data in the memory cells. The driver transistors decrease in threshold value when their gates are given a low level. Then, at the time of accessing the memory cells, the currents flowing through the transfer transistors increase to shorten the access time. During standby, a CMOS inverter having its load transistor turned on, out of the two CMOS inverters composed of the load transistors and driver transistors, decreases in leak current, thereby reducing the standby current.

In such semiconductor integrated circuits as an SRAM, the substrate areas of transistors (well regions) are typically shared among a number of transistors in order to reduce the layout size of these transistors. In other words, a single well region is formed for a number of transistors. On this account, according to the conventional art described above, drivers for driving word lines must drive the loads of not only the word lines but also the substrates of the transistors when the word lines are connected to the substrates. As a result, it takes longer time to access the memory cells even when the threshold values of the transistors are lowered.

Besides, the sources and drains of the nMOS transistors constituting the transfer transistors and the driver transistors are made up of n-type diffusion layers. Consequently, if the high level voltage of the word lines is higher than the forward bias of the pn junctions, currents can flow from the substrates (p-type well regions) to the sources or drains of the nMOS transistors when the high level voltage of the word lines is supplied to the p-type well regions. This might result in a malfunction (data crash or incorrect data read) at the time of accessing the memory cells.

SUMMARY OF THE INVENTION

It is an object of the present invention to shorten the access time of a semiconductor memory and reduce the standby current thereof.

Another object of the present invention is to prevent a malfunction at the time of accessing memory cells.

According to one of the aspects of the semiconductor memory of the present invention, memory cells have transfer transistors and driver transistors, respectively. The gates of the transfer transistors are connected to word lines, respectively. The substrates of the transfer transistors and the driver transistors are connected to the first substrate lines, respectively. First buffers of a first driver circuit generate voltages to be supplied to the word lines, respectively. Second buffers of a second driver circuit operate in synchronization with the first buffers to generate voltages to be supplied to the first substrate lines, respectively. The substrate voltages of the transfer transistors and of the driver transistors vary depending on the selection/non-selection of the word lines. Because of this, the threshold values of the transfer transistors and the driver transistors also vary depending on the selection/non-selection of the word lines.

Each of the second buffers supplies to its corresponding first substrate line a voltage for lowering the threshold values of the transfer transistors and of the driver transistors while one of the word lines is selected (in accessing the memory cells), and supplies thereto a voltage for raising the threshold values of the transfer transistors and of the driver transistors while the one of the word lines is not selected (during standby). This can heighten the operation speed at the time of accessing the memory cells and reduce the leak current during standby. Since the word lines and the first substrate lines are connected to the first buffers and the second buffers, respectively, the first substrate lines can be set at voltages different from the voltages of the word lines. Since the voltages of the first substrate lines can be set independently of the voltages of the word lines, the memory cells can be improved in electric characteristics. As a result, it is possible to shorten the access time during the operation of the semiconductor memory and reduce the standby current during standby.

According to another aspect of the semiconductor memory of the present invention, each of the second buffers supplies a power supply voltage to its corresponding first substrate line when one of the word lines is selected. This can make dispensable the circuitry for generating a high-level voltage to be supplied to the first substrate lines. As a result, the semiconductor memory can be prevented from increasing in chip size as well as in power consumption.

According to another aspect of the semiconductor memory of the present invention, each of the second buffers supplies a first voltage to its corresponding first substrate line when one of the word line is selected, the first voltage being lower than a forward bias of respective pn junctions between the substrate, and the sources and drains of the transfer transistors, and between the substrate, and the sources and drains of the driver transistors. It is therefore possible to avoid forward currents flowing through the transistors upon access to the memory cells. That is, the memory cells can be prevented from malfunctioning.

According to another aspect of the semiconductor memory of the present invention, each of the second buffers supplies a ground voltage to its corresponding first substrate line when one of the word lines is not selected. This can make dispensable the circuitry for generating a low-level voltage to be supplied to the first substrate lines. As a result, the semiconductor memory can be prevented from increasing in chip size as well as in power consumption.

According to another aspect of the semiconductor memory of the present invention, a negative voltage generator generates a negative voltage. Each of the second buffers supplies the negative voltage to its corresponding first substrate line when one of the word lines is not selected. This makes it possible to reduce the leak currents of the transfer transistors and of the driver transistors in the memory cells during standby, which can further reduce the standby current.

According to another aspect of the semiconductor memory of the present invention, each of the second buffers supplies a ground voltage to its corresponding first substrate line when one of the word lines is not selected. This eliminates the necessity of providing the circuitry for generating a high-level voltage to be supplied to the first substrate lines. As a result, the semiconductor memory can be prevented from increasing in chip size as well as in power consumption.

According to another aspect of the semiconductor memory of the present invention, memory cells have transfer transistors and load transistors, respectively. The gates of the transfer transistors are connected to word lines, respectively. The substrates of the load transistors are connected to second substrate lines, respectively. First buffers of a first driver circuit generate voltages to be supplied to the word lines, respectively. Third buffers of a third driver circuit operate in synchronization with the first buffers to generate voltages to be supplied to the second substrate lines, respectively. Thus, the threshold values of the load transistors vary depending on the selection/non-selection of the word lines.

Each of the third buffers supplies a voltage for lowering the threshold values of the load transistors to the second substrate lines while the one of the word lines is selected (in accessing the memory cells), and supplies a voltage for raising the threshold values of the load transistors while the one of the word lines is not selected (during standby). This can increase the operation speed at the time of accessing the memory cells and reduce the leak current during standby. Since the word lines and the second substrate lines are connected to the first buffers and the third buffers, respectively, the second substrate lines can be set at voltages different from the voltages of the word lines. Since the voltages of the second substrate lines can be set independently of the voltages of the word lines, the memory cells can be improved in electric characteristics. As a result, it is possible to shorten the access time during the operation of the semiconductor memory and to reduce the standby current during standby.

According to another aspect of the semiconductor memory of the present invention, a booster generates a boost voltage higher than a power supply voltage. Each of the third buffers supplies the power supply voltage to its corresponding second substrate line when one of the word lines is selected, and supplies the boost voltage, which is higher than the power supply voltage, to the corresponding second substrate line when the one of the word lines is not selected. This makes it possible to reduce the leak currents of the transfer transistors and of the load transistors in the memory cells during standby, which can further reduce standby current.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
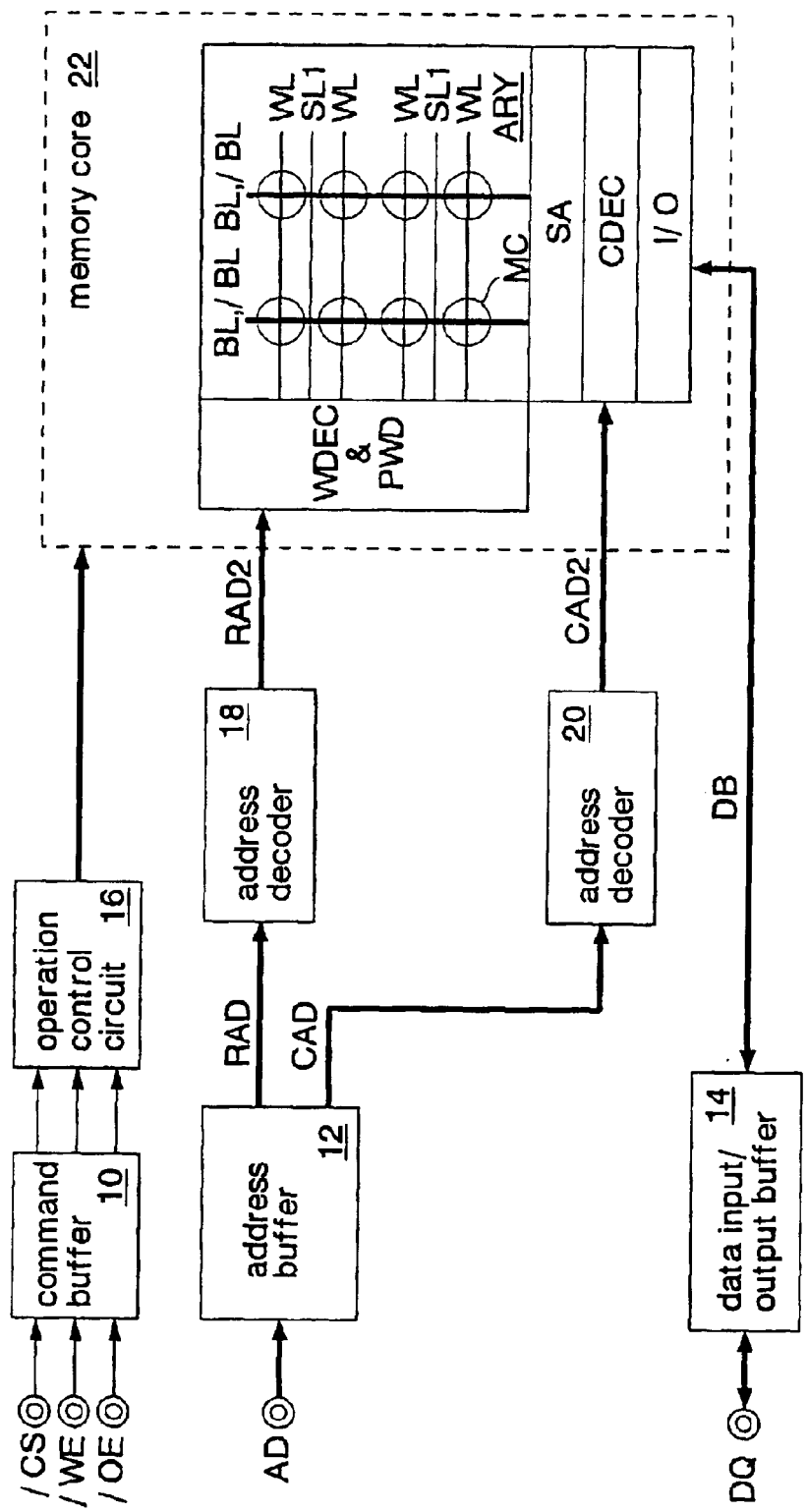
FIG. 1 is a block diagram showing a first embodiment of the semiconductor memory of the present invention.

Hereinafter, embodiments of the present invention will be described with reference to the drawings. In the drawings, each thick line represents a signal line that consists of a plurality of lines. Signals with a leading "/" are of negative logic. Double circles in the drawings represent external terminals. In the following description, signal names may be abbreviated like a "/CS signal" for a "chip select signal".

FIG. 1 shows a first embodiment of the semiconductor memory of the present invention. This semiconductor memory is formed as an SRAM on a silicon substrate by using CMOS processes.

The SRAM has a command buffer 10, an address buffer 12, a data input/output buffer 14, an operation control circuit 16, address decoders 18 and 20, and a memory core 22.

The command buffer 10 receives command signals (a chip select signal /CS, a write enable signal /WE, and an output enable signal /OE) from exterior. The address buffer 12 receives an address signal AD through an address terminal, and outputs the received signal as a row address signal RAD (upper address) and a column address signal CAD (lower address).

The data input/output buffer 14, in a read operation, receives read data from the memory core 22 through a data bus DB and outputs the received data to a data terminal DQ. In a write operation, the data input/output buffer 14 receives write data through the data terminal DQ and outputs the received data to the data bus DB.

The operation control circuit 16 decodes the command signals supplied from the command buffer 10, and outputs a control signal for operating the memory core 22. The address decoder 18 decodes the row address signal RAD and outputs the resultant as a decoding signal RAD2. The address decoder 20 decodes the column address signal CAD and outputs the resultant as a decoding signal CAD2.

The memory core 22 has a memory cell array ARY, a word decoder WDEC, a well driver PWD, a sense amplifier SA, a column decoder CDEC, and an input/output control circuit I/O. The memory cell array ARY has a plurality of word lines WL, a plurality of first substrate lines SL1, complementary bit lines BL and /BL, and memory cells MC which are arranged at the intersections of the word lines WL and the bit lines BL, /BL. Each of the first substrate lines SL1 is laid between two adjoining memory cells MC in the wiring direction of the word lines WL.

The word decoder WDEC drives (selects) any one of the word lines WL in accordance with the decoding signal RAD2 from the address decoder 18. The well driver PWD drives (selects) any one of the first substrate lines SL1 in accordance with the decoding signal RAD2. The column decoder CDEC connects any of a plurality of pairs of bit lines BL, /BL to the data bus DB in accordance with the decoding signal CAD2 from the address decoder 20. The word decoder WDEC and the well driver PWD are arranged on one side of the memory cell array ARY (on the left in the diagram) in the wiring direction of the bit lines BL, /BL.

Figure 2:
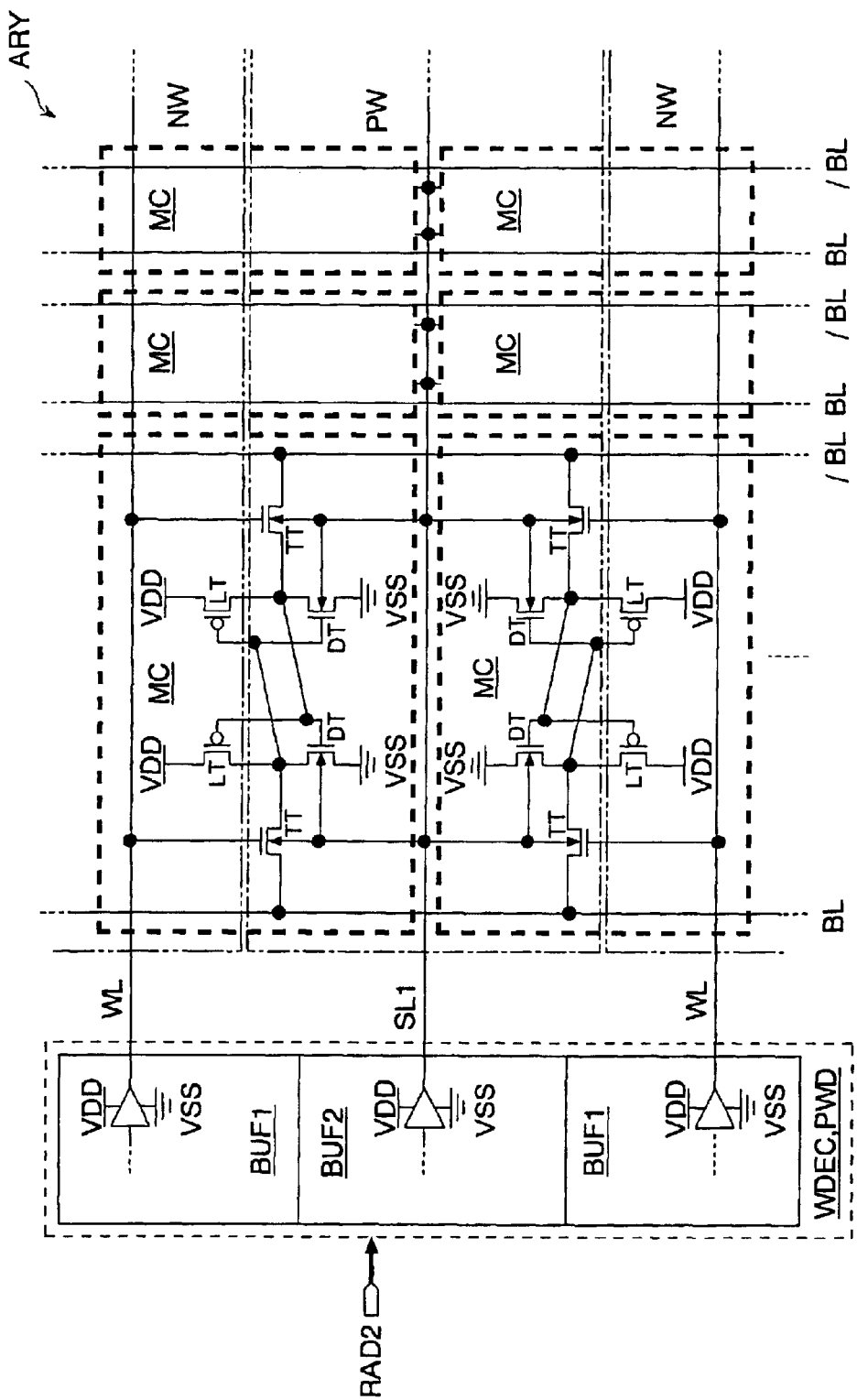
FIG. 2 is a block diagram showing the details of essential parts of the memory core shown in FIG. 1.

FIG. 2 shows the details of essential parts of the memory core 22 shown in FIG. 1.

In the memory cell array ARY, a plurality of memory cells MC, shown in thick broken-lined frames, are arranged in matrix. Each memory cell MC has two transfer transistors TT, two driver transistors DT, and two load transistors LT. The transfer transistors TT and the driver transistors DT are made up of nMOS transistors. The load transistor LT are made up of pMOS transistors. Hereinafter, nMOS transistors and PMOS transistors will sometimes be referred to simply as nMOSs and pMOSs.

The load transistors LT and the driver transistors DT form two CMOS inverters having inputs and outputs connected to each other. The sources of the load transistors LT are connected to a power supply line VDD (2 V, for example). The sources of the driver transistors DT are connected to a ground line (0 V). The transfer transistors TT connect the inputs of the CMOS inverters to the bit lines BL and /BL, respectively. The gates of the transfer transistors TT are connected to a word line WL. That is, the transistors constituting the memory cells MC are connected in the same way as ordinary 6-transistor type SRAM memory cells are.

The substrates (p-type well regions PW; dashed lines in the diagram) of the transfer transistors TT and the driver transistors DT are connected to the first substrate lines SL1.

The substrates (n-type well regions NW; double-dashed lines in the diagram) of the load transistors LT are connected to the power supply line VDD though not shown in the drawing.

Two vertically adjoining memory cells MC in the diagram are formed in mirror symmetry. The substrate areas (p-type well regions) PW of the nMOSs are formed astride two adjoining memory cell regions in the wiring direction of the word lines WL. That is, each of the well regions PW is formed in common for two adjoining memory cells MC.

Similarly, the substrate areas (n-type well regions) NW of the pMOSs are formed astride two adjoining memory cell regions in the wiring direction of the word lines WL. That is, each of the well regions NW is formed in common for two adjoining memory cells MC. Sharing the well regions PW and NW by two memory cells MC can reduce the size of the isolation areas between the memory cells MC, allowing a reduction in the size of the memory cell array ARY. In such semiconductor memories as an SRAM, the memory cell array ARY occupies most of the chip area. Consequently, it is possible to reduce the chip size and cut down the chip cost by reducing the area of the memory cell array ARY.

The word decoder WDEC has a decoding circuit (not shown) for the decoding signal RAD2, and a plurality of word buffers BUF1 (first buffers) for driving the word lines WL, respectively. Any one of the word buffers BUF1 is activated in accordance with the decoding signal RAD2. The activated word buffer BUF1 supplies a power supply voltage VDD to its corresponding word line WL. Inactivated word buffers BUF1 supply a ground voltage VSS to their corresponding word lines WL. That is, the word decoder WDEC operates as a first driver circuit having the word buffers BUF1 for driving the word lines WL.

The well driver PWD has a decoding circuit (not shown) for the decoding signal RAD2, and a plurality of well buffers (second buffers) BUF2 for driving the first substrate lines SL1, respectively. Each well buffer BUF2 is arranged between two word buffers BUF1 so as to be formed for each of the well regions PW. Since each of the well buffers BUF2 is arranged between two word buffers BUF1, the first substrate lines SL1 can be laid without intersecting the word lines WL. This facilitates the layout design of the memory cell array ARY.

Each well buffer BUF2 is formed in common for two adjoining word buffers BUF1. A well buffer BUF2 is activated when either one of the two adjacent word buffers BUF1 is activated. More specifically, a decoding signal, which has one less lower bit than the decoding signal RAD2, is supplied to the decoding circuit of the well driver PWD. The activated well buffer BUF2 supplies the power supply voltage VDD to its corresponding first substrate line SL1. In activated well buffers BUF2 supply the ground voltage VSS to their corresponding first substrate lines SL1. That is, the well driver PWD operates as a second driver circuit having the well buffers BUF2 for driving the first substrate lines SL1.

Figure 3:
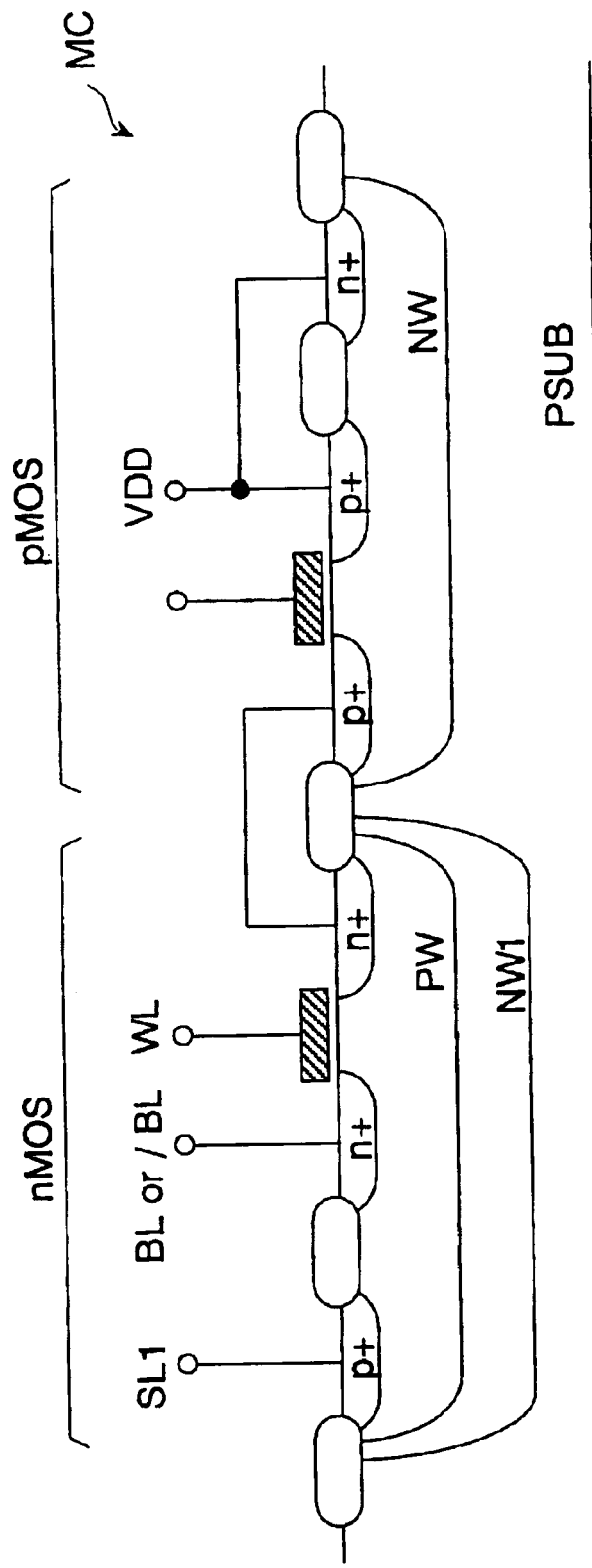
FIG. 3 is a sectional view showing the structure of the memory cells shown in FIG. 2.

FIG. 3 shows the sectional structure of the memory cells MC shown in FIG. 2. The nMOS represents a transfer transistor TT, and the PMOS a load transistor LT. In the diagram, "p+" represents a heavily doped p-type diffusion layer, and "n+" a heavily doped n-type diffusion layer.

An n-type impurity is introduced into a p-type substrate PSUB (silicon substrate) to form a well region NW1 and an n-type well region NW, which is the substrate area of the pMOS. A p-type impurity is introduced into the surface of the well region NW1 to form a p-type well region PW, which is the substrate area of the nMOS.

The structure that either one of the well regions (PW, in this example) is isolated from the substrate PSUB as above is typically referred to as triple well structure. The triple well structure facilitates electrical isolation between the well region PW of the nMOS and the substrate PSUB. That is, as shown in FIG. 2, it is possible to form a plurality of electrically isolated well regions PW. Note that with the p-type substrate, a plurality of electrically isolated n-type well regions NW can be formed by simply introducing an n-type impurity.

The source and drain (both on n+ layers) of the nMOS are formed by introducing an n-type impurity into the surface of the well region PW. One of the source and drain of the nMOS is connected to the bit line BL or /BL. The gate of the nMOS is connected to the word line WL. The other of the source and drain of the nMOS is connected to either one of the source and drain of the pMOS. The substrate (well region PW) of the nMOS is connected to the first substrate line SL1 through the p-type diffusion region (p+ layer).

The source and drain (both p+ layers) of the pMOS are formed by introducing a p-type impurity into the surface of the well region NW. The other of the source and drain of the PMOS is connected to the power supply line VDD. The gate of the pMOS is connected to the output of a not-shown CMOS inverter. The substrate (well region NW) of the pMOS is connected to the power supply line VDD through the diffusion region into which the n-type impurity is introduced (n+ layer).

Figure 4:
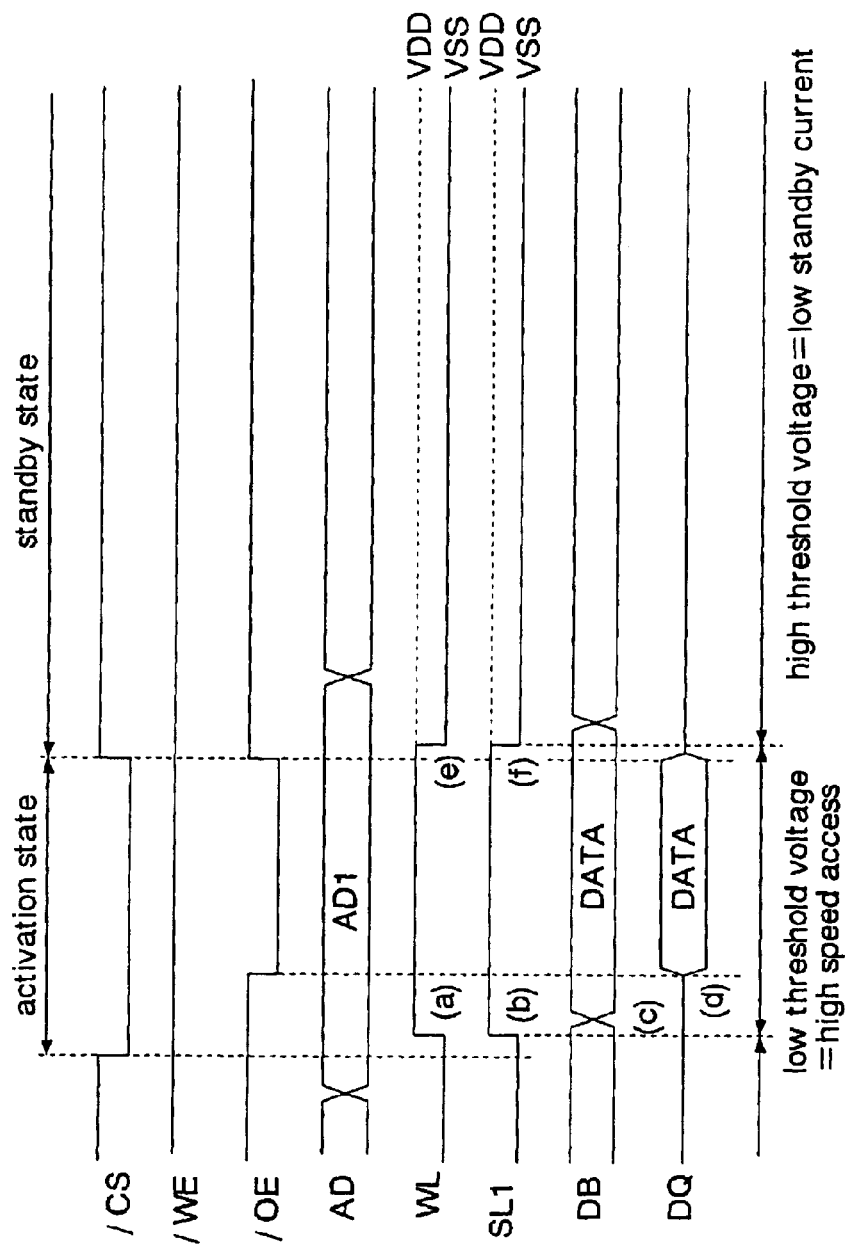
FIG. 4 is a timing chart showing the operation of the SRAM in the first embodiment.

FIG. 4 shows the operation of the SRAM in the first embodiment.

In performing a read operation or a write operation, the system unit for controlling the SRAM turns the chip select signal /CS to low level, allowing the SRAM to be in an activation state (in this example, description will be given of a read operation). When not accessing the SRAM, the system unit turns the chip select signal /CS to high level, allowing the SRAM to be in a standby state.

When an address signal AD (AD1) is supplied during the low level period of the chip select signal /CS, the word decoder WDEC selects a word line WL corresponding to the address signal AD1 and changes the voltage of this word line WL to the power supply voltage VDD (FIG. 4(a)). The well driver PWD selects the first substrate line SL1 corresponding to one of the address signals AD1 which excludes lower one bit, and changes the voltage of this first substrate line SL1 to the power supply line VDD (FIG. 4(b)). Here, the well buffers BUF2 of the well driver PWD operate in synchronization with the word buffers BUF1 of the word decoder WDEC.

The memory cells MC connected to the selected word line WL output data DATA to the data bus DB through the transfer transistors TT and the bit lines BL, /BL (FIG. 4(c)). The data DATA output to the data bus DB is output to the data terminal DQ while the output enable signal /OE is at low level (FIG. 4(d)). That is, a read operation is performed.

The p-type well regions PW of the memory cells MC selected by the word line WL are supplied with the power supply voltage VDD through the first substrate line SL1 while the word line WL is selected. Consequently, the transfer transistors TT and the driver transistors DT in the operating memory cells MC drop in threshold value. That is, the well buffer BUF2 supplies a voltage for lowering the threshold values of the transfer transistors TT and the driver transistors DT to the first substrate line SL1 when a voltage for turning on the transfer transistors TT is supplied to the word line WL. Consequently, the on-resistance of the transfer transistors TT and the driver transistors DT is lowered, thereby increasing the source-to-drain currents. This increases the operation speed of the memory cells MC, thereby shortening the access time.

Note that a plurality of well regions PW are formed in the memory cell array ARY, and each of the well regions PW decreases in load such as parasitic capacitance. It is therefore possible to minimize the driving power of the well buffers BUF2 and minimize the consumption current at the time of accessing the memory cells MC.

The word lines WL are not connected to the well regions PW but to the gates of the transfer transistors TT alone. Thus, even with an SRAM having such specifications that the voltages of the well regions PW shall be changed in synchronization with the selection of the word lines WL, it is possible to prevent the word lines WL from increasing in load. As a result, the time between the start of operation of a word buffer BUF1 and the turning-on of the transfer transistors TT is shortened significantly as compared to SRAMs in which the word lines WL are connected directly to the well regions PW. This further heightens the operation speed of the memory cells MC, which can further reduce the access time.

When the chip select signal /CS changes to high level, the SRAM enters into the standby state. The word decoder WDEC changes the voltage of the word line WL to the ground voltage VSS (FIG. 4(e)). The well driver PWD changes the voltage of the first substrate line SL1 to the ground voltage VSS (FIG. 4(f)). All the well regions PW in the memory cell array ARY are supplied with the ground voltage VSS through the first substrate lines SL1. The threshold values of the transfer transistors TT and the driver transistors DT are higher than while the memory cells MC are accessed. In other words, the well buffer BUF2 supplies, to the first substrate line SL1, a voltage for raising the threshold values of the transfer transistors TT and of the driver transistors DT when a voltage for turning off the transfer transistors TT is supplied to the word line WL. Consequently, during the standby state of the SRAM, the transfer transistors TT and the driver transistors DT become high in off-resistance, decreasing the leak currents flowing between the sources and drains. AS a result, the consumption current (standby current) decreases during the standby state.

As above, in the present embodiment, the threshold values of the transfer transistors TT and the load transistors LT are lowered in synchronization with the selection period of the word lines WL and raised in synchronization with the non-selection period of the word lines WL. This can increase the operation speed at the time of accessing the memory cells MC and reduce the leak current during standby. As a result, it is possible to shorten the access time during the operation of the SRAM and reduce the standby current.

Since the voltages of the first substrate lines SL1 can be set independently of the voltages of the word lines WL, the memory cells MC can be improved in electric characteristics.

Supplying the power supply voltage VDD and the ground voltage VSS to the first substrate lines SL1 can eliminate the necessity of providing the circuitry for generating voltages to be supplied to the first substrate lines SL1. As a result, the SRAM can be prevented from increasing in chip size as well as in power consumption.

Figure 5:
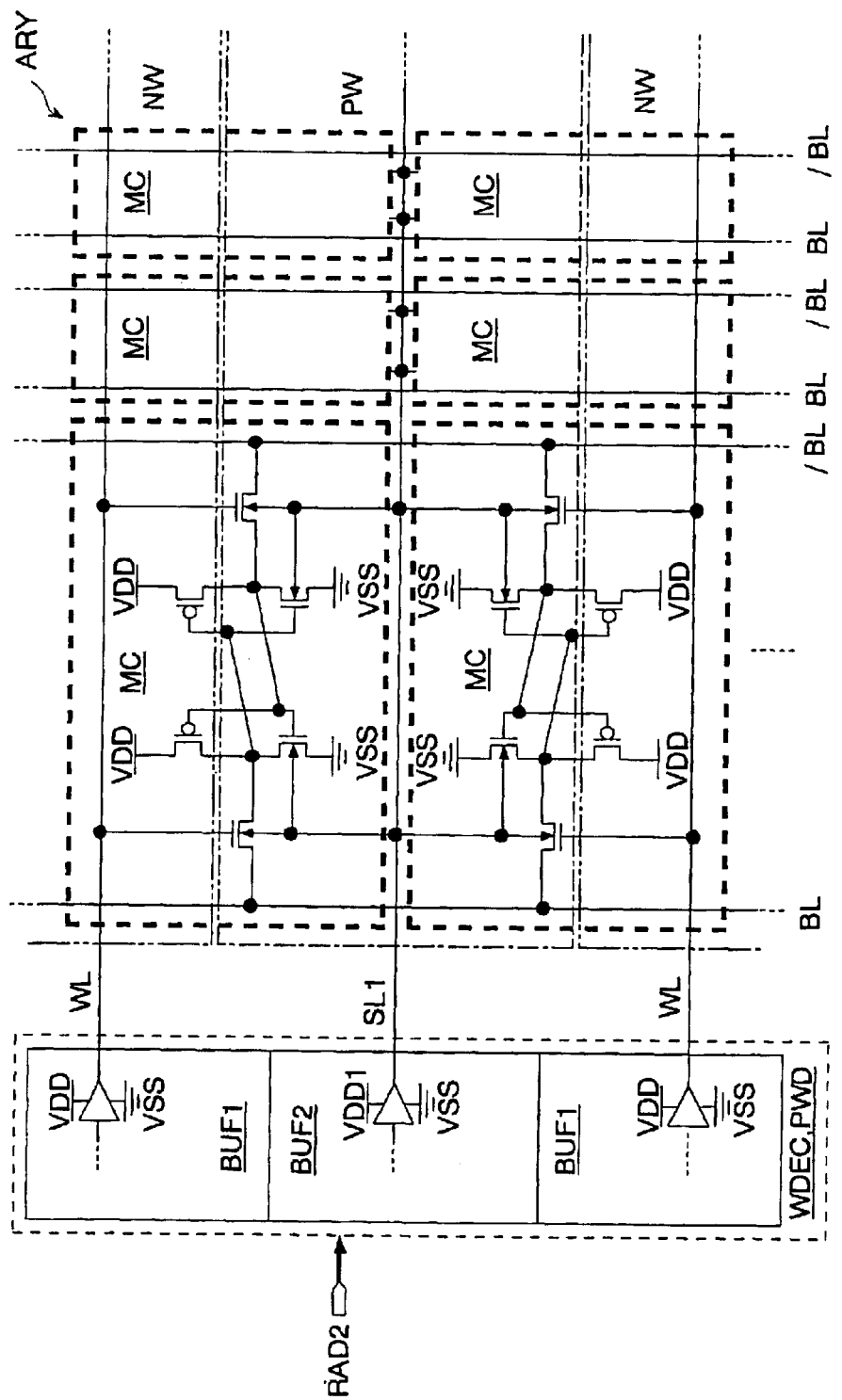
FIG. 5 is a block diagram showing essential parts of the memory cell array according to a second embodiment of the semiconductor memory of the present invention.

FIG. 5 shows essential parts of the memory cell array according to a second embodiment of the semiconductor memory of the present invention. The same elements as those described in the first embodiment will be designated by identical reference numbers or symbols. Detailed description thereof will be omitted here.

The semiconductor memory of this embodiment is formed as an SRAM on a silicon substrate by using CMOS processes. The individual blocks constituting the SRAM are almost the same as in the first embodiment (FIG. 1).

In this embodiment, the well buffer BUF2 of the well driver PWD supplies a first voltage VDD1 lower than the power supply voltage VDD to the first substrate line SL1 when an adjacent word buffer BUF1 supplies the power supply voltage VDD to the word line WL. The configuration of the memory cell array ARY is otherwise the same as in the first embodiment (FIG. 2).

The first voltage VDD1 is generated by stepping down the power supply voltage VDD by resistance division or the like. The first voltage VDD1 is set at a voltage lower than the forward bias of the pn junctions of the transfer transistors TT and the driver transistors DT. That is, there holds the relationship: the power supply voltage VDD>the forward bias>the first voltage VDD1. Consequently, in accessing the memory cells MC, the first voltage VDD1 can be supplied to the first substrate lines SL1 without forward currents flowing through the pn junctions of the transfer transistors TT and the driver transistors DT. This reduces the operating current at access time and avoids a malfunction at access time.

This embodiment can offer the same effects as those of the first embodiment described above. Moreover, this embodiment describes the first voltage VDD1 supplied to the first substrate lines SL1 during the selection of the word lines WL, the first voltage VDD1 being lower than the forward bias of the pn junctions between the substrate, and the sources and drains of the transfer transistors TT, and between the substrate, and the sources and drains of the driver transistors DT. It is therefore possible to prevent forward currents from flowing through the transistors when the memory cells MC are accessed. That is, the memory cells MC can be prevented from malfunctioning. Besides, in accessing the memory cells MC, it is possible to prevent extra currents unused for the access from flowing through the memory cells MC.

Figure 6:
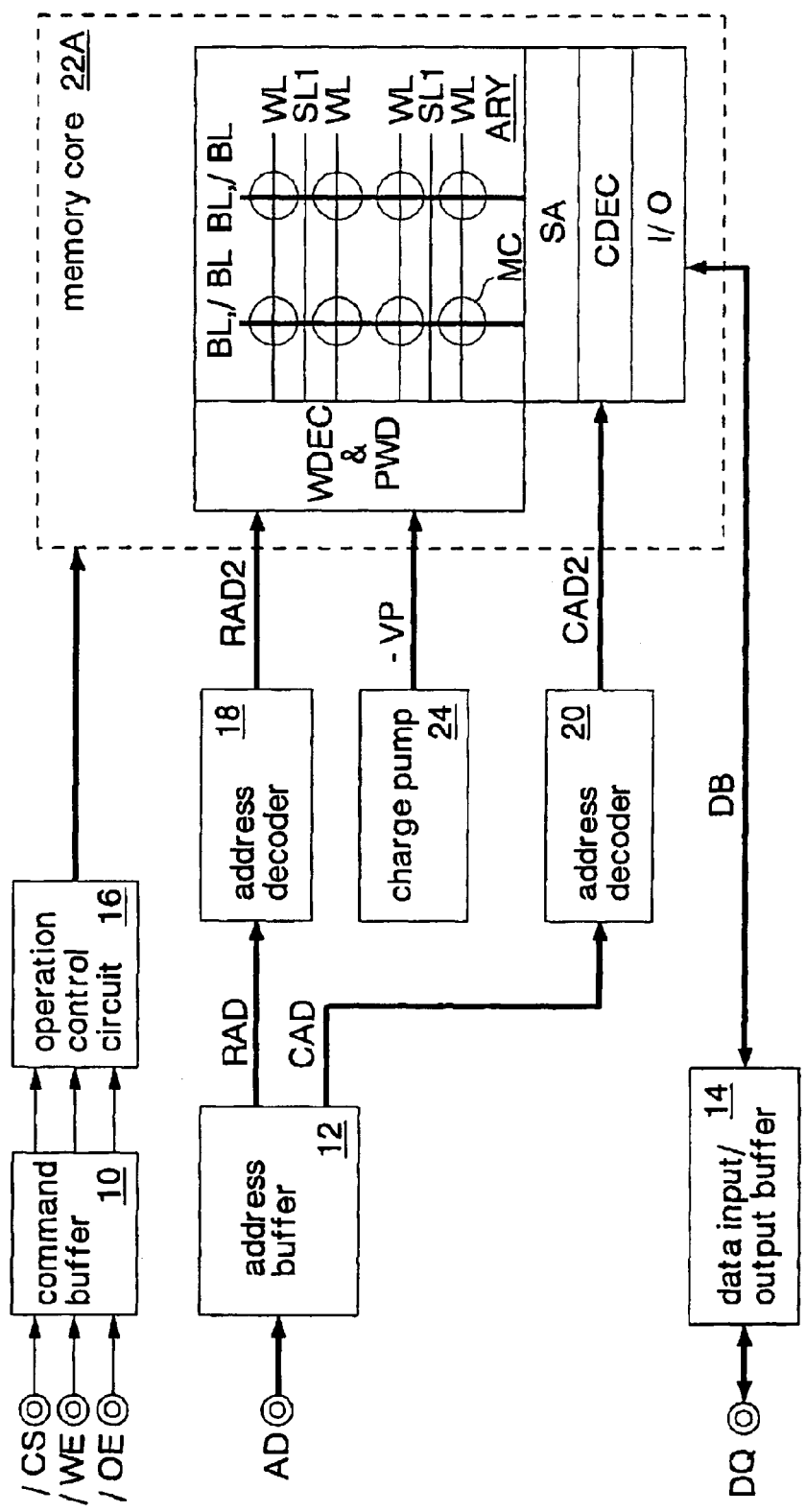
FIG. 6 is a block diagram showing a third embodiment of the semiconductor memory of the present invention.

FIG. 6 shows a third embodiment of the semiconductor memory of the present invention. The same elements as those described in the first embodiment will be designated by identical reference numbers or symbols. Detailed description thereof will be omitted here.

The SRAM of this embodiment has a memory core 22A instead of the memory core 22 of the first embodiment. In addition, additionally formed is a charge pump 24 (negative voltage generator) for generating a negative voltage "−VP". The negative voltage "−VP" generated by the charge pump 24 is supplied to the well driver PWD. The rest of the configuration is almost the same as in the first embodiment.

Figure 7:
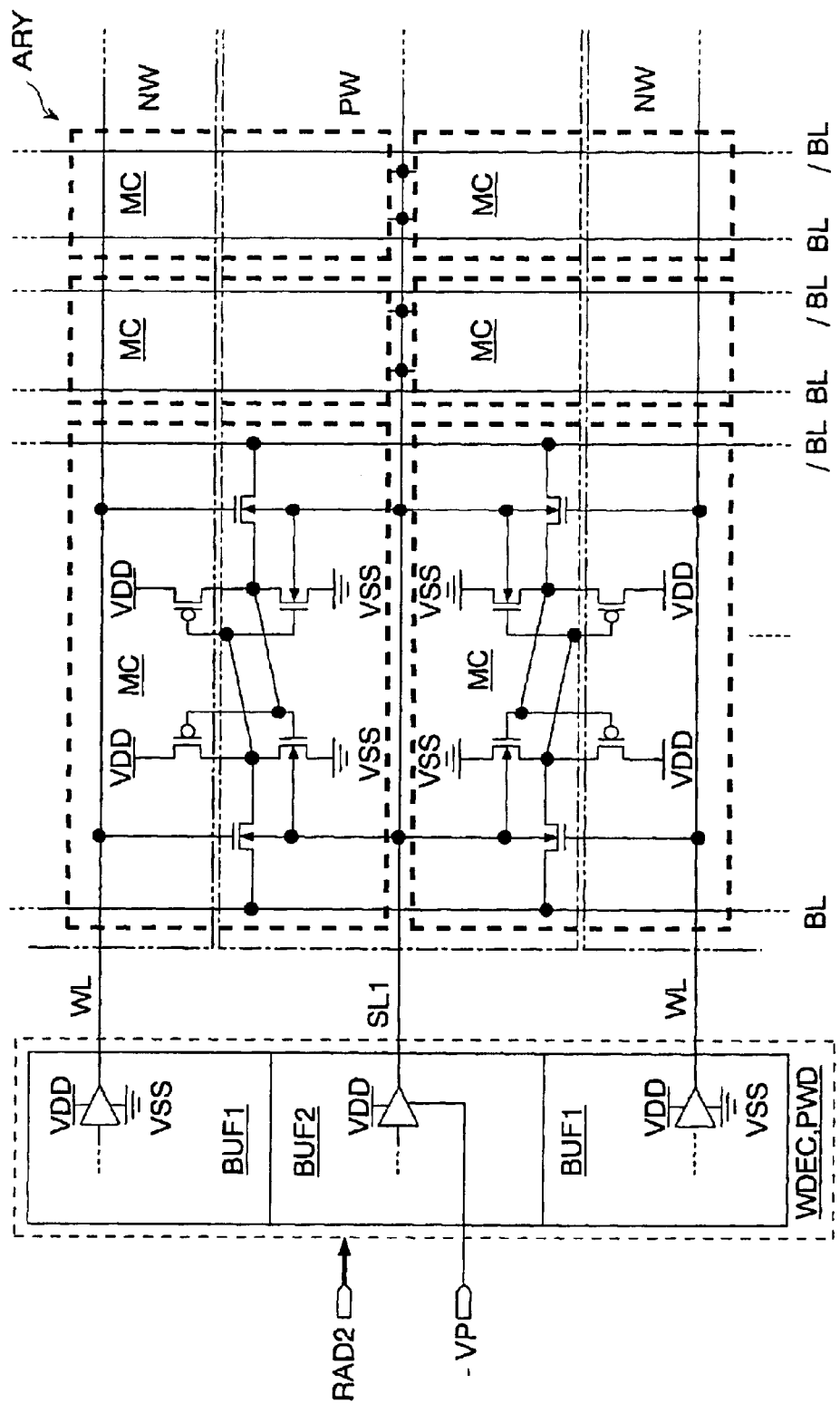
FIG. 7 is a block diagram showing the details of essential parts of the memory core shown in FIG. 6.

FIG. 7 shows the details of essential parts of the memory core 22A shown in FIG. 6.

The well buffers BUF2 of the well driver PWD supply the power supply voltage VDD to the first substrate lines SL1, respectively, when either of the two adjacent word buffers BUF1 supplies the power supply voltage VDD to the word lines WL. The well buffers BUF2 of the well driver PWD supply the negative voltage "−VP" to the first substrate lines SL1 when both of the two adjacent word buffers BUF1 supply the ground voltage VSS to the word lines WL, respectively. The configuration of the memory cell array ARY is otherwise the same as in the first embodiment (FIG. 2).

In this embodiment, the well buffers BUF2 in the standby state supply the negative voltage "−VP" to the first substrate lines SL1. In the standby state of this embodiment, the threshold values of the transfer transistors TT and the driver transistors DT thus are higher than in the first and second embodiments. Consequently, the standby current decreases further.

This embodiment can offer the same effects as those of the first embodiment described above. Moreover, in this embodiment, the negative voltage "−VP" is supplied to the first substrate lines SL1 when the word lines WL are not selected. In the standby state, it is therefore possible to reduce the leak currents of the transfer transistors TT and the driver transistors DT. This allows a further reduction in standby current.

Figure 8:
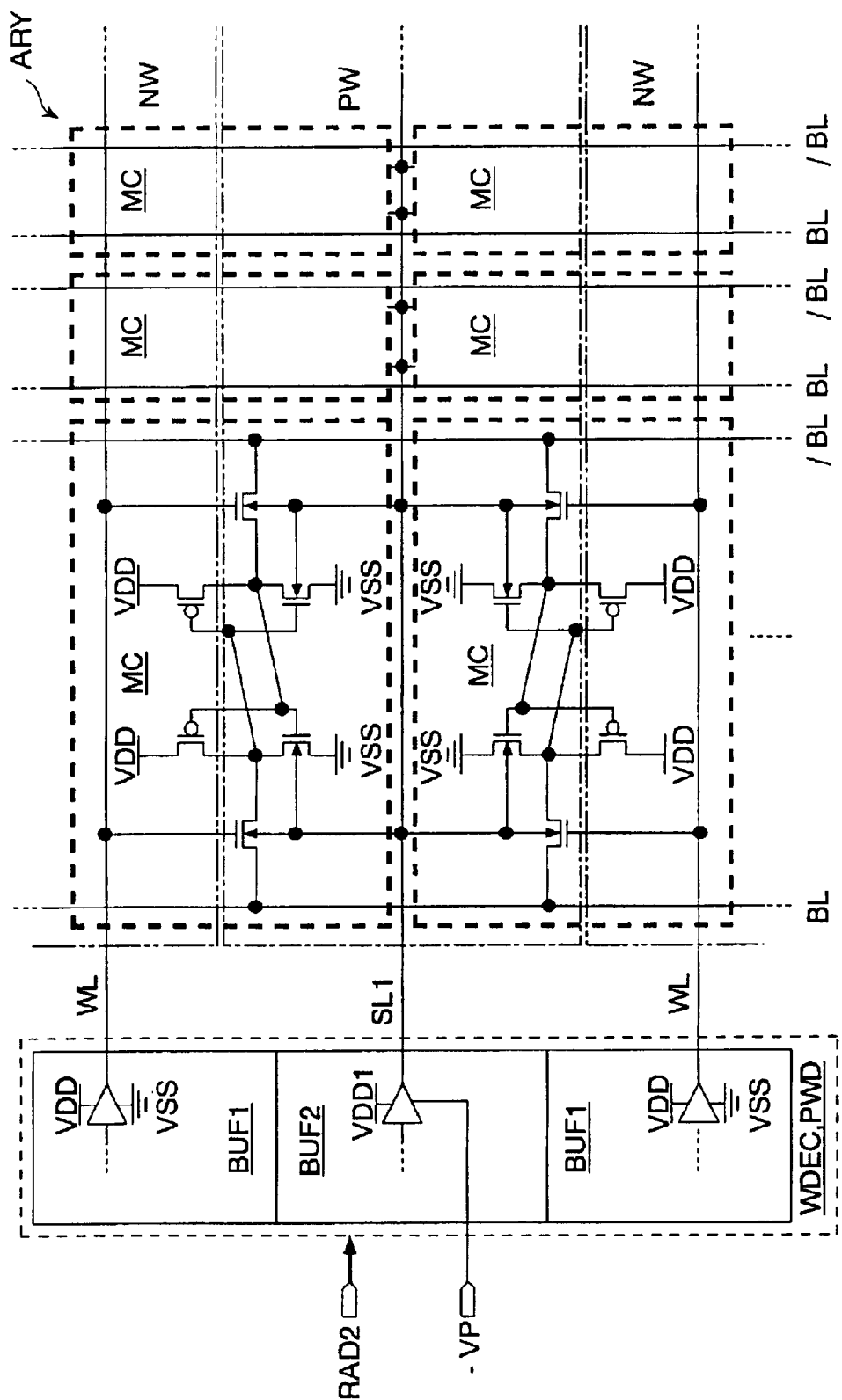
FIG. 8 is a block diagram showing essential parts of the memory cell array according to a fourth embodiment of the semiconductor memory of the present invention.

FIG. 8 shows essential parts of the memory cell array according to a fourth embodiment of the semiconductor memory of the present invention. The same elements as those described in the first and third embodiments will be designated by identical reference numbers or symbols. Detailed description thereof will be omitted here.

The semiconductor memory of this embodiment is formed as an SRAM on a silicon substrate by using CMOS processes. The individual blocks constituting the SRAM are almost the same as in the third embodiment (FIG. 6).

In this embodiment, each well buffer BUF2 of the well driver PWD supplies a first voltage VDD1 higher than the power supply voltage VDD to its first substrate line SL1 when either one of the two adjacent word buffers BUF1 supplies the power supply voltage VDD to the word line WL. The first voltage VDD1 is set at a voltage lower than the forward bias of the pn junctions of the transfer transistors TT and the driver transistors DT. That is, there holds the relationship: the forward bias>the first voltage VDD1>the power supply voltage VDD.

Moreover, the well buffer BUF2 of the well driver PWD supplies the negative voltage "−VP" to the first substrate line SL1 when both of the two adjacent word buffers BUF1 supply the ground voltage VSS to the word lines WL. The configuration of the memory cell array ARY is otherwise the same as in the third embodiment (FIG. 7).

In accessing the memory cells MC, the first voltage VDD1 higher than the power supply voltage VDD is supplied to the substrates (well regions PW) of the transfer transistors TT and the driver transistors DT. Consequently, the operating speed of the transfer transistors TT and the driver transistors DT becomes faster. Moreover, as in the second embodiment, no forward current flows through the pn junctions of the transfer transistors TT and the driver transistors DT when the memory cells MC are accessed. This prevents extra currents unused for the access to the memory cells from occurring, which precludes a malfunction during the access.

In the standby state, the negative voltage "−VP" is supplied to the substrates (well regions PW) of the transfer transistors TT and the driver transistors DT. The standby current is thus reduced as in the third embodiment.

This embodiment can offer the same effects as those obtained from the first to third embodiments described above.

Figure 9:
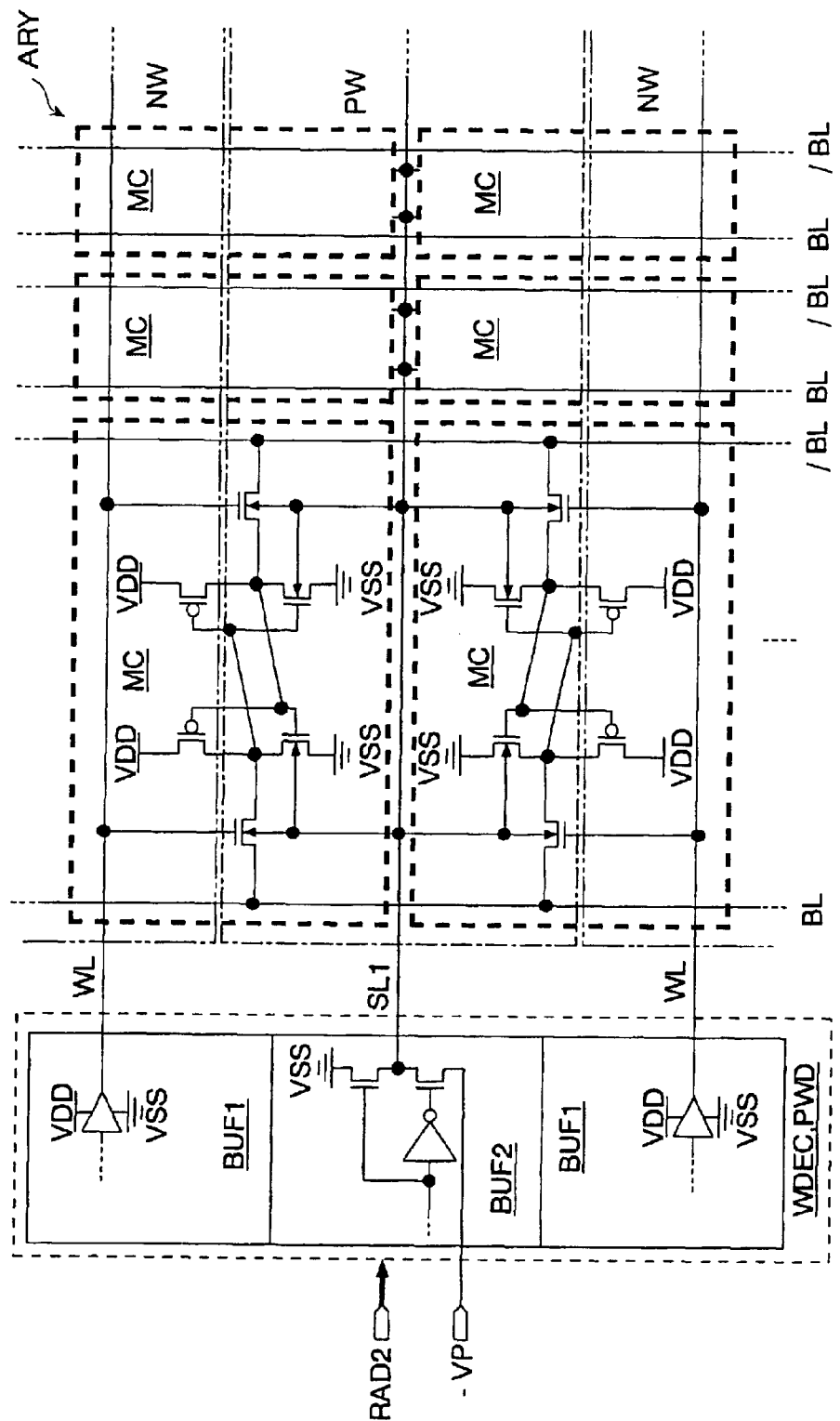
FIG. 9 is a block diagram showing essential parts of the memory cell array according to a fifth embodiment of the semiconductor memory of the present invention.

FIG. 9 shows essential parts of the memory cell array according to a fifth embodiment of the semiconductor memory of the present invention. The same elements as those described in the first and third embodiments will be designated by identical reference numbers or symbols. Detailed description thereof will be omitted here.

The semiconductor memory of this embodiment is formed as an SRAM on a silicon substrate by using CMOS processes. The individual blocks constituting the SRAM are almost the same as in the third embodiment (FIG. 6).

In this embodiment, each well buffer BUF2 of the well driver PWD supplies the ground voltage VSS to its first substrate line SL1 when either one of the two adjacent word buffers BUF1 supplies the power supply voltage VDD to the word line WL. The ground voltage VSS is also the first voltage lower than the forward bias of the pn junctions of the transfer transistors TT and the driver transistors DT. The logic of a signal to be supplied to the input terminal of the well buffer BUF2 is the same as the logic of a signal to be supplied to the input terminals of the word buffers BUF1 which supply the power supply voltage VDD to the word lines WL. Moreover, the well buffer BUF2 of the well driver PWD supplies the negative voltage "−VP" to the first substrate line SL1 when both of the two adjacent word buffers BUF1 supply the ground voltage VSS to the word lines WL. The configuration of the memory cell array ARY is otherwise the same as in the third embodiment (FIG. 7).

This embodiment is applicable to an SRAM in which the nMOS transistors of the memory cells MC are set at a lower threshold value for the sake of achieving high speed operation. If the present invention is not applied to the SRAM with the threshold voltage set at a lower value, the transistors will have high subthreshold currents (leak currents), and accordingly standby current will increase. The substrates (well regions PW) of the transfer transistors TT and the driver transistors DT are set to the ground voltage VSS when the word lines WL are selected (at access time), and set to the negative voltage "−VP" when the word lines WL are not selected (during standby). This suppresses the standby current and shortens the access time even with the threshold voltage set at a lower value.

This embodiment can offer the same effects as those obtained from the first and third embodiments described above. Moreover, in this embodiment, the ground voltage VSS is supplied to the first substrate lines SL1 when the word lines WL are not selected. This can make dispensable the circuitry for generating a high-level voltage to be supplied to the first substrate lines SL1. As a result, the SRAM can be prevented from increasing in chip size as well as in power consumption.

Figure 10:
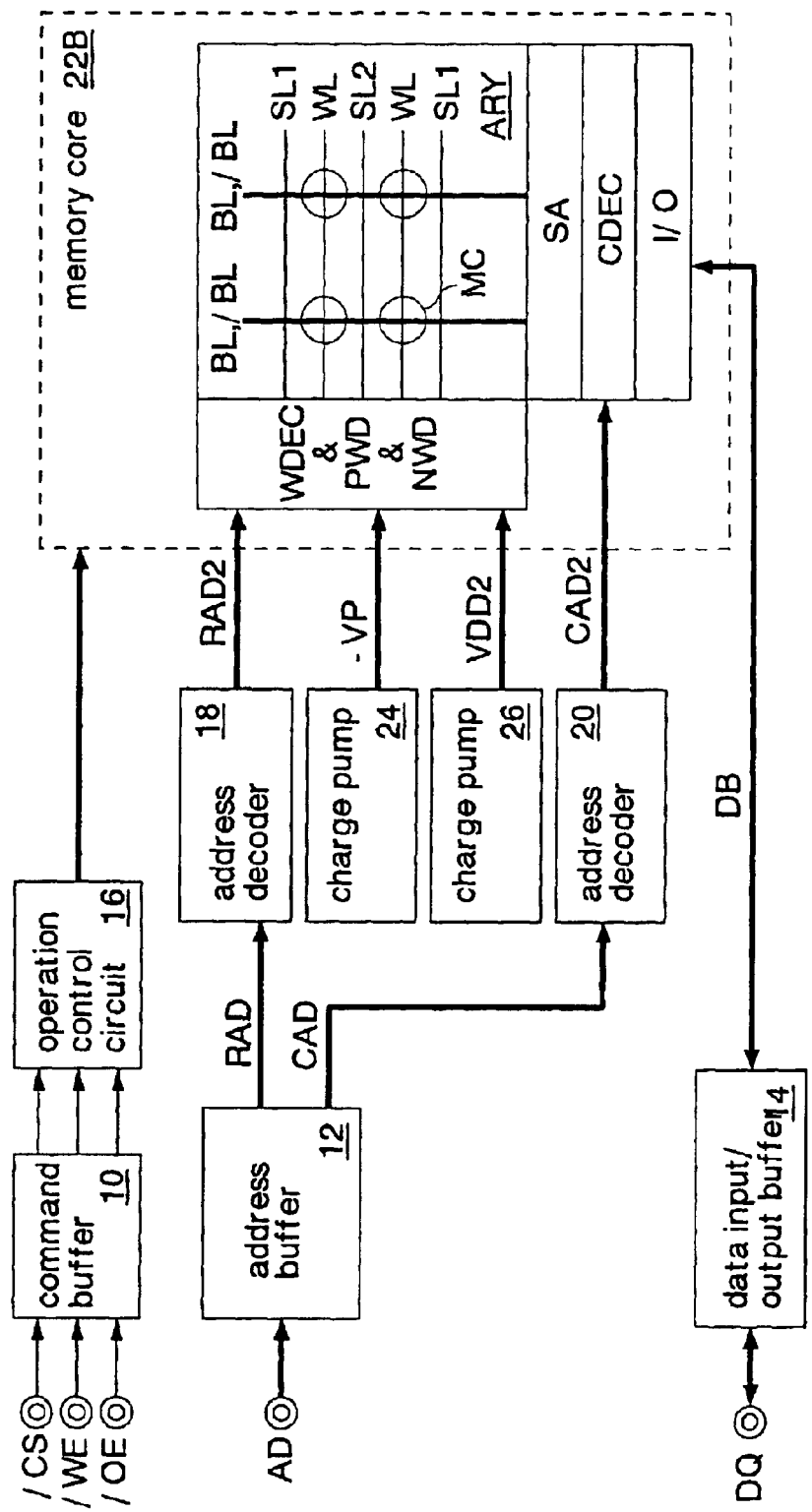
FIG. 10 is a block diagram showing a sixth embodiment of the semiconductor memory of the present invention.

FIG. 10 shows a sixth embodiment of the semiconductor memory of the present invention. The same elements as those described in the first and third embodiments will be designated by identical reference numbers or symbols. Detailed description thereof will be omitted here.

The SRAM of this embodiment has a memory core 22B instead of the memory core 22A of the third embodiment. Besides, a charge pump 26 (booster) for generating a second voltage VDD2, a boost voltage, is formed additionally. The second voltage VDD2 generated by the charge pump 26 is supplied to a well driver NWD (to be described later) which is the substrates of the pMOS transistors of the memory cells MC. The configuration is otherwise the same as in the third embodiment. The memory core 22B is provided with the additional well driver NWD aside from the word decoder WDEC and the well driver PWD. The outputs of the well driver NWD are connected to second substrate lines SL2.

Figure 11:
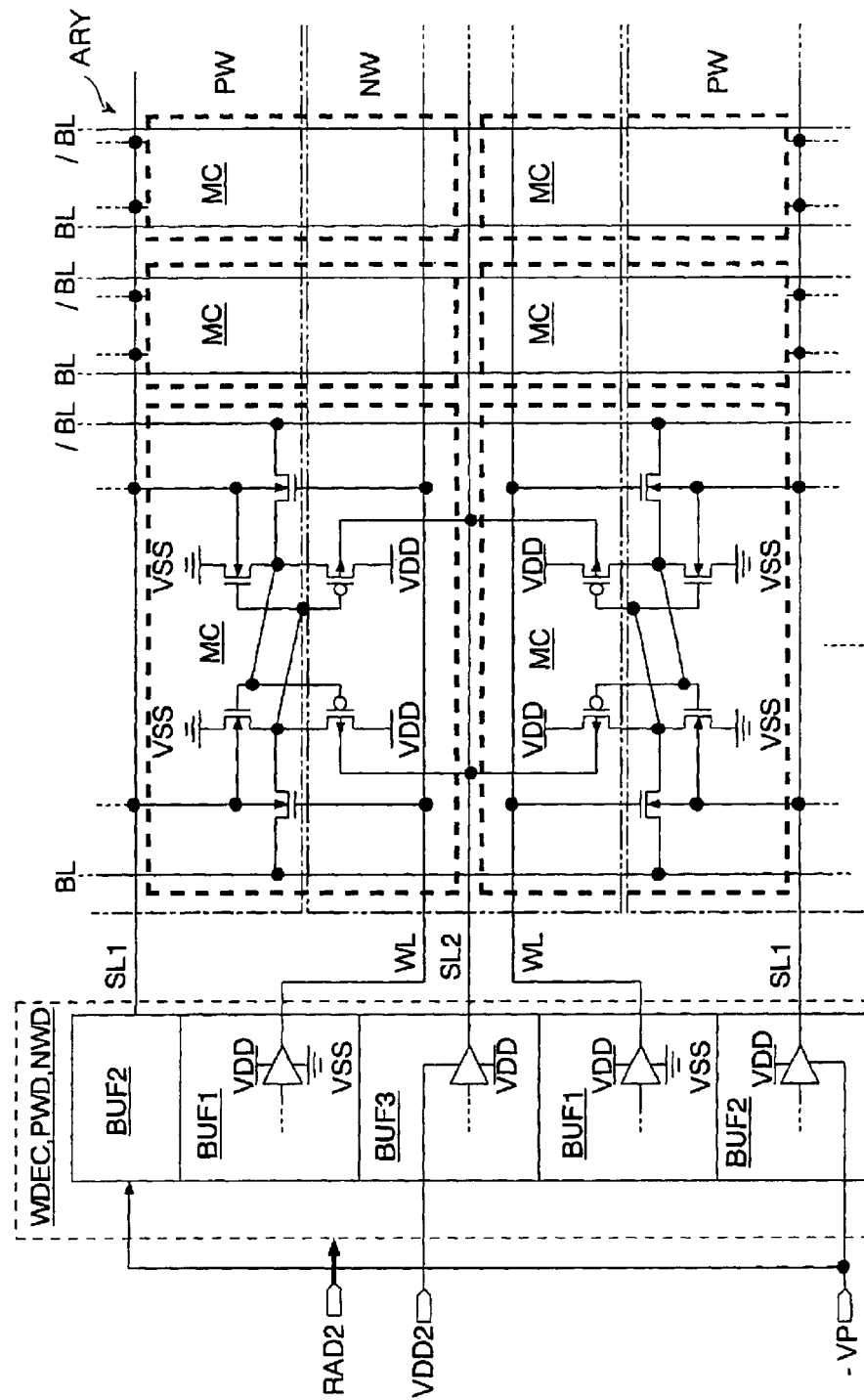
FIG. 11 is a block diagram showing the details of essential parts of the memory core shown in FIG. 10.

FIG. 11 shows the details of essential parts of the memory core 22B shown in FIG. 10.

FIG. 11 shows the substrates of the pMOS transistors (n-type well regions NW) at the center of the diagram. As in the first embodiment, two vertically adjoining memory cells MC are formed in mirror symmetry. The substrates of the nMOSs (p-type well regions PW) are formed in common for two adjoining memory cells MC. Similarly, the substrates of the pMOSs (n-type well regions NW) are formed in common for two adjoining memory cells MC as in the embodiments described before. The well regions NW (the substrates of the load transistors LT) are connected to the second substrate lines SL2.

The memory core 22B has the word decoder WDEC, the well driver PWD, and the well driver NWD on one side of the memory cell array ARY. The well driver PWD and the well driver NWD are arranged as interlaced with the word decoder WDEC. The word decoder WDEC and the well driver PWD are the same as in the third embodiment (FIG. 7). The word decoder WDEC has word buffers BUF1 whose outputs are connected to the word lines WL, respectively. The well driver PWD has well buffers BUF2 whose outputs are connected to the first substrate lines SL1, respectively.

The well driver NWD has a decoding circuit (not shown) for the decoding signal RAD2, and a plurality of well buffers BUF3 (third buffers) for driving the second substrate lines SL2, respectively. Each well buffer BUF3 supplies the power supply voltage VDD to its second substrate line SL2 when either one of the two adjacent word lines WL is selected. The well buffer BUF3 supplies the second voltage VDD2 higher than the power supply voltage VDD to the second substrate line SL2 when both of the two adjacent word lines WL are selected. In this way, the well driver NWD operates as a third driver circuit having the well buffers BUF3 for driving the second substrate lines SL2.

In this embodiment, in the standby state of the SRAM, the second voltage higher than the power supply voltage is supplied to the load transistors LT. This raises the threshold values of the load transistors LT and reduces the leak current. In accessing the memory cells MC, the power supply voltage VDD is supplied to the substrates of the load transistors LT. Consequently, the threshold values of the load transistors LT decrease for lower on-resistances. The operation of the transfer transistors TT and the driver transistors DT is the same as in the third embodiment.

Along with the threshold values of the transfer transistors TT and the driver transistors DT, the threshold values of the load transistors are changed in accordance with the selection/non-selection of the word lines WL. Thus, at the time of accessing the memory cells MC, the transistors operate at high speed. When the memory cells MC are not accessed (during standby), the leak currents of the transistors are reduced.

This embodiment can offer the same effects as those obtained from the first and third embodiments described above. Moreover, in the present embodiment, the threshold values of the load transistors LT are lowered in synchronization with the selection period of the word lines WL, and raised in synchronization with the non-selection period of the word lines WL. The operation speed at the time of accessing the memory cells MC can thus be improved with a reduction in the leak current during standby. As a result, it is possible to shorten the access time during the operation of the SRAM and reduce the standby current.

When the word lines WL are not selected, the second voltage VDD2 higher than the power supply voltage VDD is supplied to the second substrate lines SL2. It is therefore possible to reduce the leak currents of the load transistors LT of the memory cells MC during standby. This allows a further reduction in standby current.

In the foregoing embodiments, description has been given of the cases where the well driver PWD and the word decoder WDEC are arranged on one side of the memory cell array ARY. Otherwise, description has been given of the cases where the well drivers PWD, NWD and the word decoder WDEC are arranged on one side of the memory cell array ARY. However, the present invention is not limited to such embodiments.

Figure 12:
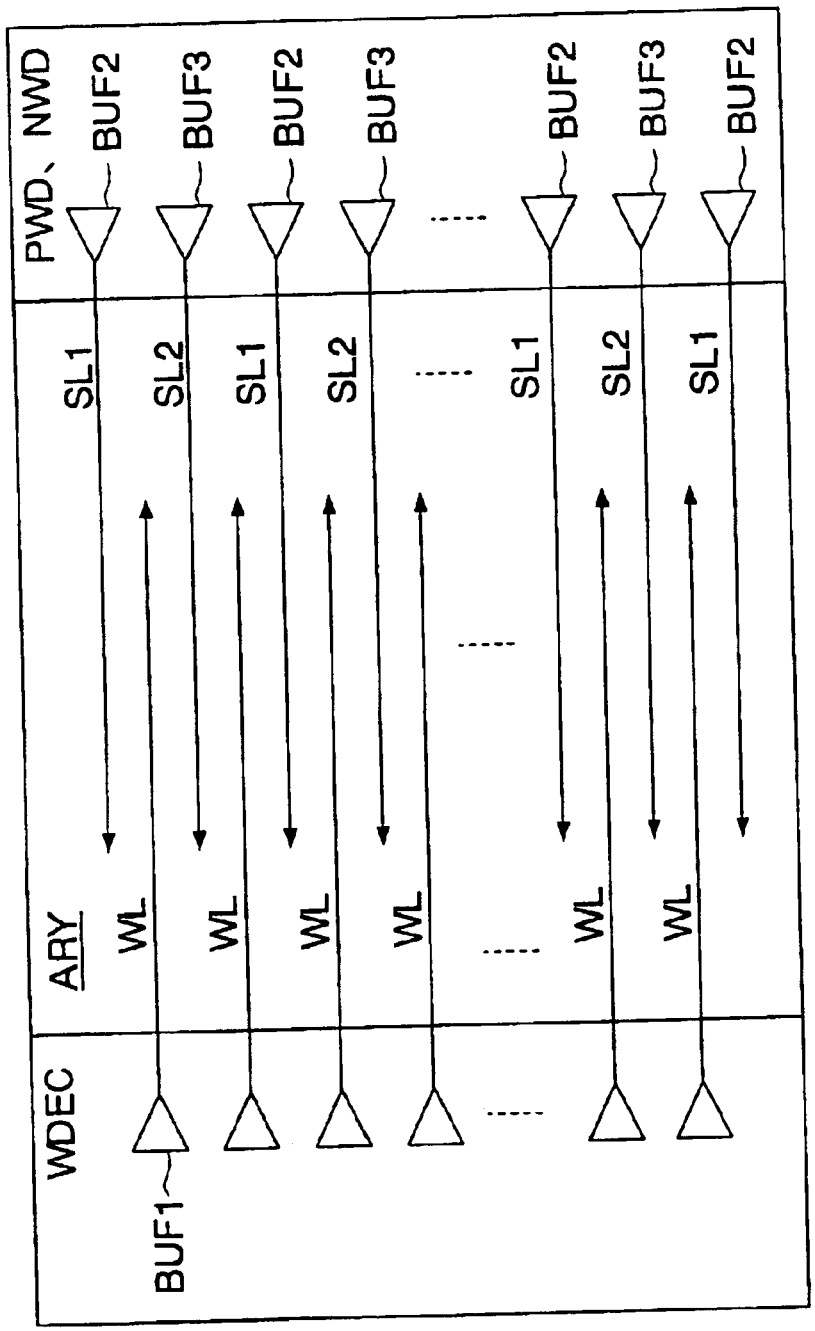
FIG. 12 is a block diagram showing another example of arrangement of well drivers.

For example, as shown in FIG. 12, the well drivers PWD and NWD (or either one of the well drivers PWD and NWD) may be arranged on the side of the memory cell array ARY opposite from the word decoder WDEC. Adapting the layout shown in FIG. 12 can shorten the design time especially when the present invention is applied to existing memory cores. When the well drivers PWD, NWD are formed on the other side of the memory cell array ARY, as shown in the diagram, the layout area can be reduced by arranging the well buffers BUF2 and BUF3 alternately.

Moreover, in the foregoing embodiments, description has been given of the cases where the well buffers BUF2 of the well driver PWD are arranged between the word buffers BUF1. Otherwise, description has been given of the cases where the well buffers BUF2 of the well driver PWD and the well buffers BUF3 of the well driver NWD are arranged alternately between the word buffers BUF1. However, the present invention is not limited to such embodiments.

Figure 13:
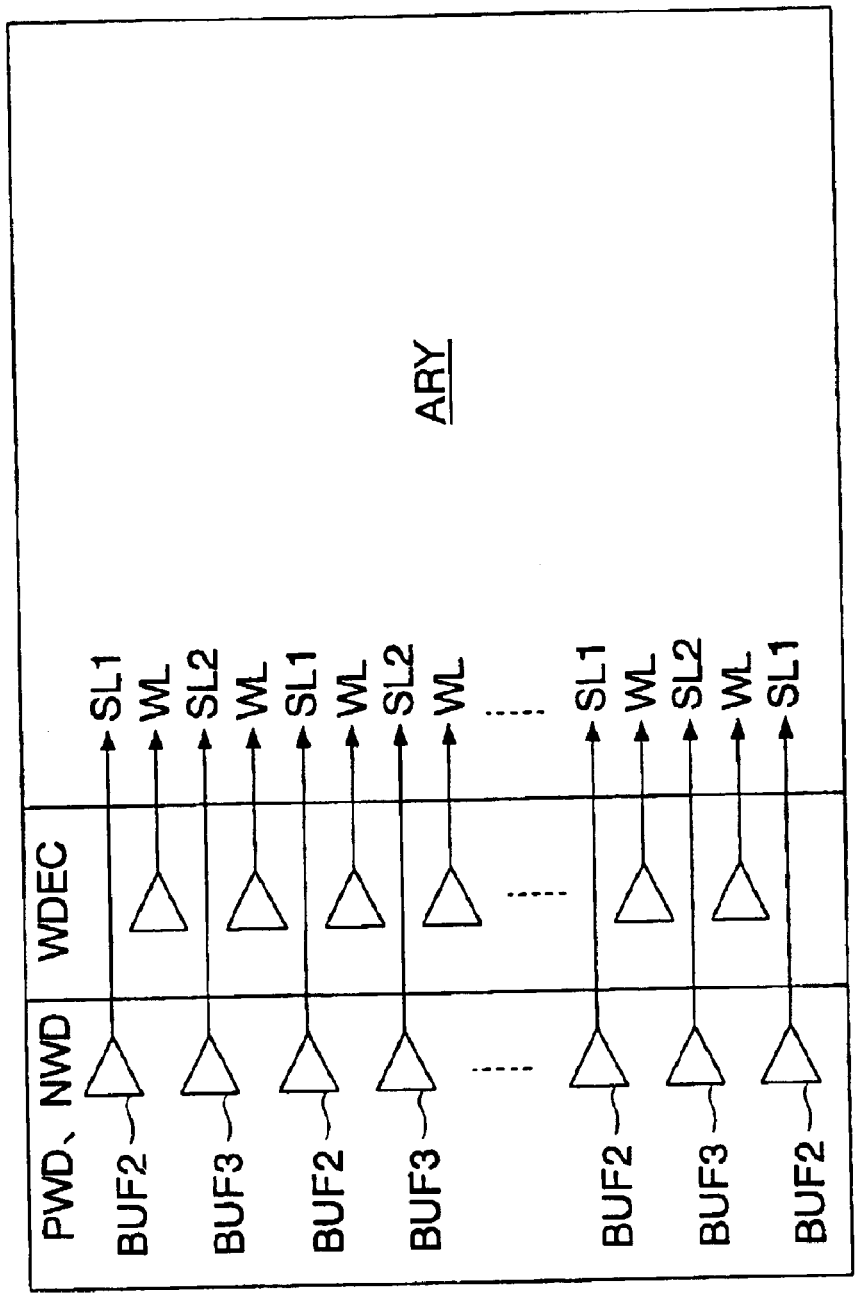
FIG. 13 is a block diagram showing another example of arrangement of the well drivers.

For example, as shown in FIG. 13, the well drivers PWD and NWD (or either one of the well drivers PWD and NWD) may be separately arranged along the word decoder WDEC. Adapting the layout shown in FIG. 13 can shorten the design time especially when the present invention is applied to existing memory cores. In the cases where both the well drivers PWD and NWD are formed, the layout area of the well drivers PWD and NWD can be reduced by arranging the well buffers BUF2 and BUF3 alternately as shown in FIG. 13.

The foregoing embodiments have dealt with the cases where the present invention is applied to an SRAM. However, the present invention is not limited to such embodiments. For example, the present invention may be applied to a logic LSI such as a CPU, or an SRAM core to be implemented on a system memory.

The invention is not limited to the above embodiments and various modifications may be made without departing from the spirit and scope of the invention. Any improvement may be made in part or all of the components.

What is claimed is:

1. A semiconductor memory comprising:
a plurality of memory cells having transfer transistors and driver transistors, respectively;
a plurality of word lines connected to gates of said transfer transistors, respectively;
a first driver circuit having a plurality of first buffers for generating voltages to be supplied to said word lines, respectively;
a plurality of first substrate lines connected to substrates of said transfer transistors and of said driver transistors, respectively; and
a second driver circuit having a plurality of second buffers for operating in synchronization with said first buffers to generate voltages to be supplied to said first substrate lines, respectively.

2. The semiconductor memory according to claim 1, wherein:
each of said second buffers supplies a voltage for lowering threshold values of said transfer and driver transistors to its corresponding first substrate line of said first substrate lines when a voltage for turning on said transfer transistors is supplied to one of said word lines;
each of said second buffers supplies a voltage for raising the threshold values of said transfer and driver transistors to said corresponding first substrate line when a voltage for turning off said transfer transistors is supplied to said one of said word lines.

3. The semiconductor memory according to claim 2, wherein
each of said second buffers supplies a power supply voltage to said corresponding first substrate line when the voltage for turning on said transfer transistors is supplied to said one of said word lines.

4. The semiconductor memory according to claim 2, wherein
each of said second buffers supplies a first voltage to said corresponding first substrate line when the voltage for turning on said transfer transistors is supplied to said one of said word lines, said first voltage being lower than a forward bias of respective pn junctions between a substrate, and sources and drains of said transfer transistors, and between a substrate, and sources and drains of said driver transistors.

5. The semiconductor memory according to claim 4, wherein
said first voltage is lower than a power supply voltage.

6. The semiconductor memory according to claim 4, wherein
said first voltage is higher than a power supply voltage.

7. The semiconductor memory according to claim 2, wherein
each of said second buffers supplies a ground voltage to said corresponding first substrate line when the voltage for turning off said transfer transistors is supplied to said one of said word lines.

8. The semiconductor memory according to claim 2, further comprising
a negative voltage generator for generating a negative voltage, wherein
each of said second buffers supplies said negative voltage to said corresponding first substrate line when the voltage for turning off said transfer transistors is supplied to said one of said word lines.

9. The semiconductor memory according to claim 8, wherein
each of said second buffers supplies a ground voltage to said corresponding first substrate line when the voltage for turning on said transfer transistors is supplied to said one of said word lines.

10. The semiconductor memory according to claim 1, comprising
a memory cell array composed of said memory cells, wherein
said first and second driver circuits are arranged on one side of said memory cell array.

11. The semiconductor memory according to claim 10, wherein
each of said second buffers of said second driver circuit is arranged between two first buffers of said first driver circuit.

12. The semiconductor memory according to claim 1, comprising
a memory cell array composed of said memory cells, wherein
said first driver circuit is disposed on one side of said memory cell array and said second driver circuit is disposed on the other side of said memory cell array.

13. The semiconductor memory according to claim 1, wherein:

said first substrate lines are connected to first substrate areas, respectively, each of said first substrate areas being formed in common for two adjoining memory cells of said memory cells; and said second buffers are formed correspondingly to said first substrate areas, respectively.

14. A semiconductor memory comprising:

a plurality of memory cells having transfer transistors and load transistors, respectively;

a plurality of word lines connected to gates of said transfer transistors, respectively;

a first driver circuit having a plurality of first buffers for generating voltages to be supplied to said word lines, respectively;

a plurality of substrate lines connected to substrates of said load transistors, respectively; and a second driver circuit having a plurality of second buffers for operating in synchronization with said first buffers to generate voltages to be supplied to said substrate lines, respectively.

15. The semiconductor memory according to claim 14, wherein:

each of said second buffers supplies a voltage for lowering threshold values of said load transistors to its corresponding substrate line of said substrate lines when a voltage for turning on said transfer transistors is supplied to one of said word lines; and each of said second buffers supplies a voltage for raising the threshold values of said load transistors to said corresponding substrate line when a voltage for turning off said transfer transistors is supplied to said one of said word lines.

16. The semiconductor memory according to claim 15, further comprising a booster for generating a boost voltage higher than a power supply voltage, wherein each of said second buffers supplies said power supply voltage to said corresponding substrate line when the voltage for turning on said transfer transistors is supplied to said one of said word lines; and each of said second buffers supplies said boost voltage to said corresponding substrate line when the voltage for turning off said transfer transistors is supplied to said one of said word lines.

17. The semiconductor memory according to claim 14, further comprising a memory cell array composed of said memory cells, wherein said first and second driver circuits are arranged on one side of said memory cell array.

18. The semiconductor memory according to claim 14, wherein each of said second buffers of said second driver circuit are arranged between two first buffers of said first driver circuit.

19. The semiconductor memory according to claim 14, comprising a memory cell array composed of said memory cells, wherein said first driver circuit is disposed on one side of said memory cell array and said second driver circuit is disposed on the other side of said memory cell array.

20. The semiconductor memory according to claim 14, wherein:

said substrate lines are connected to substrate areas, respectively, each of said substrate areas being formed in common for two adjoining memory cells of said memory cells; and said second buffers are formed correspondingly to said substrate areas, respectively.

* * * * *